(12) United States Patent
Lim et al.

(10) Patent No.: US 11,545,077 B2
(45) Date of Patent: Jan. 3, 2023

(54) SELECTIVELY CONTROLLABLE MICROLED SYSTEM (71) Applicant: Seong Kyu Lim, Daegu (KR)

(72) Inventors: Seong Kyu Lim, Daegu (KR); Myeong Hee Kim, Daegu (KR); Jong Ho Lim, Daegu (KR); Jong Yoon Lim, Daegu (KR)

(73) Assignee: Seong Kyu Lim, Daegu (KR)

( * ) Notice: Subject to any disclaimer, the term of this patent is extended or adjusted under 35 U.S.C. 154(b) by 0 days.

(21) Appl. No.: 17/440,716

(22) PCT Filed: Mar. 18, 2020

(86) PCT No.: PCT/KR2020/003662
§ 371 (c)(1),
(2) Date: Sep. 17, 2021

(87) PCT Pub. No.: WO2020/190011
PCT Pub. Date: Sep. 24, 2020

(65) Prior Publication Data
US 2022/0172671 A1 Jun. 2, 2022

(30) Foreign Application Priority Data
Mar. 19, 2019 (KR) .................. 10-2019-0030893

(51) Int. Cl.
G09G 3/32 (2016.01)
G09G 3/00 (2006.01)

(52) U.S. Cl.
CPC .............. G09G 3/32 (2013.01); G09G 3/035 (2020.08); G09G 2320/0626 (2013.01);
(Continued)

(58) Field of Classification Search
CPC .......... G09G 3/32; G09G 3/30; G09G 3/3208; G09G 3/3225; G09G 3/3233;
(Continued)

(56) References Cited

U.S. PATENT DOCUMENTS

| 2014/0022151 | A1* | 1/2014 | Cuff | ............... G09G 3/3208 345/81 |
| 2014/0053315 | A1* | 2/2014 | Pond | ............... G09G 3/20 2/144 |
| 2016/0142863 | A1* | 5/2016 | Lam | ............... H04W 4/029 455/41.2 |

FOREIGN PATENT DOCUMENTS

| JP | 2018-531481 A | 10/2018 |
| KR | 10-1250997 B1 | 4/2013 |

(Continued)

OTHER PUBLICATIONS

International Search Report dated Jul. 21, 2020, for corresponding International Patent Application No. PCT/KR2020/003662.
(Continued)

Primary Examiner — Koosha Sharifi-Tafreshi
(74) Attorney, Agent, or Firm — Hauptman Ham, LLP (57) ABSTRACT The present invention relates to a selectively controllable microLED system, and more specifically, to a technology having a transparent microLED display skin that is formed to be worn on the outer surface of any one from among a specific device, a specific product, and a body part, having a master unit and a remote slave for controlling the transparent microLED display skin that are independently or respectively formed on one side of any one from among the specific device, the specific product, and the body part, and having a smartphone allowing a wearer to ultimately and selectively control the transparent microLED display skin, and thus the present invention enables the color of any one from among the specific device, the specific product, and the (Continued)

body part to be selectively changed according to the current situation of the wearer.

4 Claims, 5 Drawing Sheets

(52) U.S. Cl.
CPC ............... *G09G 2320/0666* (2013.01); *G09G 2330/021* (2013.01); *G09G 2360/144* (2013.01); *G09G 2370/06* (2013.01)

(58) Field of Classification Search
CPC ...... G09G 3/3258; G09G 3/324; G09G 3/035; G09G 2380/02; G09G 3/03; G06F 1/1652; G06F 2203/04102; H01L 2251/5338; H01L 51/0097; G09F 9/301; H04M 1/0268
See application file for complete search history.

(56) References Cited

FOREIGN PATENT DOCUMENTS

| | | |
|---|---|---|
| KR | 10-2016-0007015 A | 1/2016 |
| KR | 10-1597707 B1 | 2/2016 |
| KR | 10-2017-0016147 A | 2/2017 |
| KR | 10-2018-0131684 A | 12/2018 |
| KR | 10-1926714 B1 | 12/2018 |
| KR | 10-1926715 B1 | 12/2018 |

OTHER PUBLICATIONS

Written Opinion dated Jul. 21, 2020, for corresponding International Patent Application No. PCT/KR2020/003662.

* cited by examiner

SELECTIVELY CONTROLLABLE MICROLED SYSTEM

CROSS-REFERENCE TO RELATED APPLICATION

The present application is a national stage filing under 35 U.S.C § 371 of PCT application number PCT/KR2020/003662 filed on Mar. 18, 2020 which is based upon and claims the benefit of priorities to Korean Patent Application No. 10-2019-0030893, filed on Mar. 19, 2019, in the Korean Intellectual Property Office, which are incorporated herein in their entireties by reference.

TECHNICAL FIELD

The present invention relates to a selectively controllable microLED system, and more specifically, to a technology having a transparent microLED display skin that is formed to be worn on the outer surface of any one from among a specific device, a specific product and a body part, and depending on situations, the transparent microLED display skin may be expressed as monochromatic colors or other various colors.

BACKGROUND ART

In general, in order to express unique designs in products or devices such as wigs, clothing, and ornaments as well as body nails, other logos, and the nails are polished with nail polish, or a separate device capable of emitting light in the same manner as the nail polish does is configured to attached so that the device is used for highlighting such part.

On the other hand, the ornaments may include rings, earrings, necklaces, bracelets, gloves, wristwatches, headbands, artificial nails wigs, hats and the like, and ornaments used for portable product may include umbrellas, parasols, dresses, fans, handbags, handkerchiefs, belts, and the like.

In some cases, the above-described ornaments, specific devices, body parts, products for interior design, and other devices, in general, are used by configuring a separate LED capable of emitting the light, however, in modern society, users perform a single design or a monochromatic light-emitting function, and therefore, when using for a long time, users are often getting bored or unsatisfied, therefore pursue new designs, and yet, it is inevitable that a lot of economic burdens is to meet needs for such users.

In a case where the interior design is being carried out, a plurality of specific devices, specific products, and wallpapers are usually filled. If such specific devices and specific products are purchased and disposed once, changes in position may be possible when necessary, and as for changing colors, the surfaces of specific devices and products may be changed by attaching colored sheets, however, it is not neat, and requiring intensive-labor, and is not capable of transform over several times, and is not capable of changing its design. Even for the wallpaper, when single wallpaper is configured to use, a unique design is created by providing the wallpaper with some features, a sense of monotony may inevitably exist using such limited designs.

In addition, an ornament, a specific device, a body part, and an interior design product or the like, which is configured with conventional light-emitting LEDs is the technology that is mostly expressed in a monotonous color, and in order to express in a variety of colors, there is a problem in that not only a plurality of LED lights are provided, but also requires to onerously change or recharge batteries frequently due to high power consumption, and economically low in efficiency.

Due to such a problem, a light-emitting system using a microLED that is low in power consumption with relatively high brightness is gaining attention lately, and the microLED is applied in a variety of fields and configured to be used in various products and devices.

As described in the conventional technology related to the microLED,

Korean Patent Registration No. 10-1926715 discloses a technique related to a method for manufacturing a microLED comprising the steps of: preparing a first substrate; forming a first electrode layer basic material that forms on the first substrate; forming a first conductive bonding layer material that forms on the first electrode layer basic material; forming a batch pattern that forms a first electrode layer and a first conductive bonding layer by collectively forming a pattern on the first conductive electrode layer basic material and the first conductive bonding layer basic material; and mounting a chip that mounts a first surface of a microLED chip on the first conductive bonding layer, wherein the chip mounting method comprises the steps of: forming a hydrophilic surface or a hydrophobic surface to form the hydrophilic surface or the hydrophobic surface on a first surface or a second surface of a microLED wafer or a plurality of the microLED chips; aligning a chip to float placing a plurality of the microLED chips in a water bath so that the hydrophilic surface is naturally aligned in the underwater direction or the hydrophobic surface is naturally aligned in the water surface direction; adhering at least one microLED chip with the vacuum pressure using a vacuum hole formed on a vacuum adhesion plate; and mounting the microLED chip adhered by releasing the vacuum pressure on the first conductive bonding layer.

Korean Patent Registration No. 10-1926714 discloses a technique related to a method for manufacturing a microLED comprising the steps of: preparing a first substrate that is formed on a first electrode layer; forming a first conductive paste on the first electrode layer; mounting a chip that mounts a first surface of the microLED chip on the first conductive paste; preparing a second substrate formed on a second electrode layer; forming a second conductive paste that forms a second conductive paste on a second surface of the microLED chip or the second electrode layer; and mounting a second substrate inverting the second substrate and mounting the second conductive paste on a second surface of the microLED chip; wherein the chip mounting comprises the steps of: forming a hydrophilic surface or a hydrophobic surface to form the hydrophilic surface or the hydrophobic surface on a first surface or a second surface of a microLED wafer or a plurality of the microLED chips; aligning a chip to float by placing a plurality of the microLED chips in a water bath so that the hydrophilic surface is naturally aligned in the underwater direction or the hydrophobic surface is naturally aligned in the water surface direction; adhering to at least one microLED chip with the vacuum pressure using a vacuum hole formed on a vacuum adhesion plate; and mounting the microLED chip adhered by releasing the vacuum pressure on the first conductive bonding layer.

Korean Patent Registration No. 10-1597707 discloses a technique related to a wireless powered lighting system comprising: a primary coil connected to the light-emitting device, a bottle cap that is used for sealing cover connected to the primary coil; a secondary coil corresponding to the primary coil; a bottle opener having a battery connected to the secondary coil, and a built-in wireless recharging unit for recharging the battery, wherein the primary coil is disconnected and light-emitting is stopped, when the bottle cap is damaged by the bottle opener.

The above-described conventional art focuses on improving productivity and reducing manufacturing time and cost, facilitating electrical or mechanical coupling, or implementing a light-emitting system without a built-in power source like a battery.

However, the above-described arts may, generally, improve the process of manufacturing a general microLED and have an effect on durability, but as described above, various transformations of such a specific device, a specific product, and a body part required for the microLEDs is a technology that is impossible to apply to places where used and is a technology that may not be customized to the taste of users, where situations are changing rapidly.

DISCLOSURE OF INVENTION

Technical Problem

Therefore, the present invention has been made in view of the above problems, and it is an object of the present invention to, unlike a function capable of expressing a monotonous color of a light-emitting system using a conventional microLED, be easily applied to a specific device, a specific product, a body part, or the like. On the other hand, when applied to the specific device, specific product, or body part, various colors may be expressed selectively according to the user's operation command rather than expressing in a monotonous color, thereby satisfying the needs of users in a rapidly changing modern society. In accordance with an aspect of the present invention is accomplished by emphasizing the basis of providing a selectively controllable microLED system.

Technical Solution

To accomplish the above-mentioned objects, according to one aspect of the present invention, there is provided a light-emitting system comprising: a transparent flexible substrate 310 having transparency and flexibility on the outer surface of any one of a specific device 10, a specific product 20 and a body part 30, and a transparent microLED display skin 300 configured to be adhered and transferred a semiconductor device layer 320 having microLED pixels 330 on the transparent flexible substrate 310, and worn on the outer surface of the body part 30; a power switch 410 controls a power supply unit 430 configured to be spaced apart from the transparent microLED display skin 300 on the outer surface of any one of the specific device 10, the specific product 20 and the body part, a charging port 420 configured to charge a battery via a USB cable, a power supply unit 430 configured to be controlled from the power switch 410, a battery 440 configured to store electric power charged by the charging port 420, a wireless power supply unit 450 having a wireless electric coil for wirelessly supplying power to the power supply unit 450, a short-range wireless communication unit 460 configured to perform the short-range wireless communication with external devices including a smartphone 600 and other devices, and a master unit 400 having a main control unit 470 to perform controlling the color expression of the transparent microLED display skin 300; a wireless electric antenna 510 configured to receive power generated from the wireless power supply unit 450, in which a position or a mounting spaced apart in a predetermined distance between the master unit 400 and the outer surface of any one of the specific device 10, the specific product 20 and the body part 30 or carried by a user, a remote control unit 520 configured to drive and control the transparent microLED display skin 300, and a remote slave 500 including a transceiver 530 to perform a closest remote transceiving from/to the master unit 400; a smartphone 600 including APP configured to control the master unit 400 or the main control unit 470 of the remote slave 500 or the remote control unit 520.

It is a technical feature that the master unit 400 and the remote slave 500 are configured with light detection units 490 and 550 for detecting external light brightness, and after any one of the specific device 10, the specific product 20, and the body part 30 is applied from external light intensity is being detected, then applied to the main control unit 470 and the remote control unit 520 respectively, and based on the applied light intensity, the main control unit 470 and the remote control unit 520 controls a display brightness of the transparent microLED display skin 300.

In addition, it is a technical feature that the master unit 400 and the remote slave 500 configured with the harvesting unit 480 and 540 for self-generating energy, and are configured with any one of a photoelectric element, a thermoelectric element, a piezoelectric element, and wireless electric conversion element, or a combination thereof.

It is another technical feature that when a specific transparent microLED display skin 300 is controlled via the APP, the transparent microLED display skin 300 is controlled in the master unit 400 that is adjacent to the specific transparent microLED display skin 300 or the remote slave 500.

Advantageous Effects

According to a selectively controllable microLED system of the present invention, it is advantageous that not only a microLED display skin may easily be adhered to a specific product, and a body part, but also possible to apply in various fields which provide a diversity in use, and on the other hand, the selectively controllable microLED system may easily be controlled via smartphones that are always carried by users, which provides convenience when in use, and may be transformed easily in various colors and glitters as in whole or in part depending on the purpose of use, allowing immediate response to the situation, and as a result, not only may enhance the user's excitement and satisfaction, but also may be used for a long time through a low power and a self-powered supply such as a rechargeable battery.

10: Specific device 20: Specific product 30: Body part
300: Transparent micro-LED display skin
310: Transparent flexible substrate 320: Semiconductor display layer 330: micro-LED pixel
331: Positive electrode layer 332: Transparent conductive layer
333: Transparent p-electrode layer 334: p-GaN layer
335: Active layer 336: n-Gan layer
337: Transparent n-electrode layer 338: Transparent dielectric layer
400: Master unit
410: Power switch 420: Charging port 430: Power unit
440: Battery 450: Remote power supply unit 460: Short-range wireless communication unit
470: Main control unit 480: Harvesting unit 490: Light detection unit
500: Remote slave
510: Remote electric antenna 520: Remote control unit
530: Transceiver unit
540: Harvesting unit 550: Light detection unit
600: Smartphone

BEST MODE FOR CARRYING OUT THE INVENTION

The present invention relates to a selectively controllable microLED system, and more specifically, to a technology having a transparent microLED display skin that is formed to be worn on the outer surface of any one from among a specific device, a specific product and a body part, and depending on situations, the transparent microLED display skin may be expressed as monochromatic colors or other various colors.

The aforementioned and additional aspects of the present disclosure will become more apparent through exemplary embodiments described with reference to the accompanying drawings from FIGS. 1 to 5.

The selectively controllable microLED system according to the present invention comprising a transparent microLED display skin 300 that is formed to be worn on the outer surface of any one from among a specific device 10, a specific product 20, and a body part 30, having a master unit 400 and a remote slave 500 configured to be spaced apart from the microLED display skin 300, in which a smartphone 600 that may be selectively control the master unit 400 and remote slave 500, so that users may use in various use and purpose according to the current situation of the user.

Figure 1:
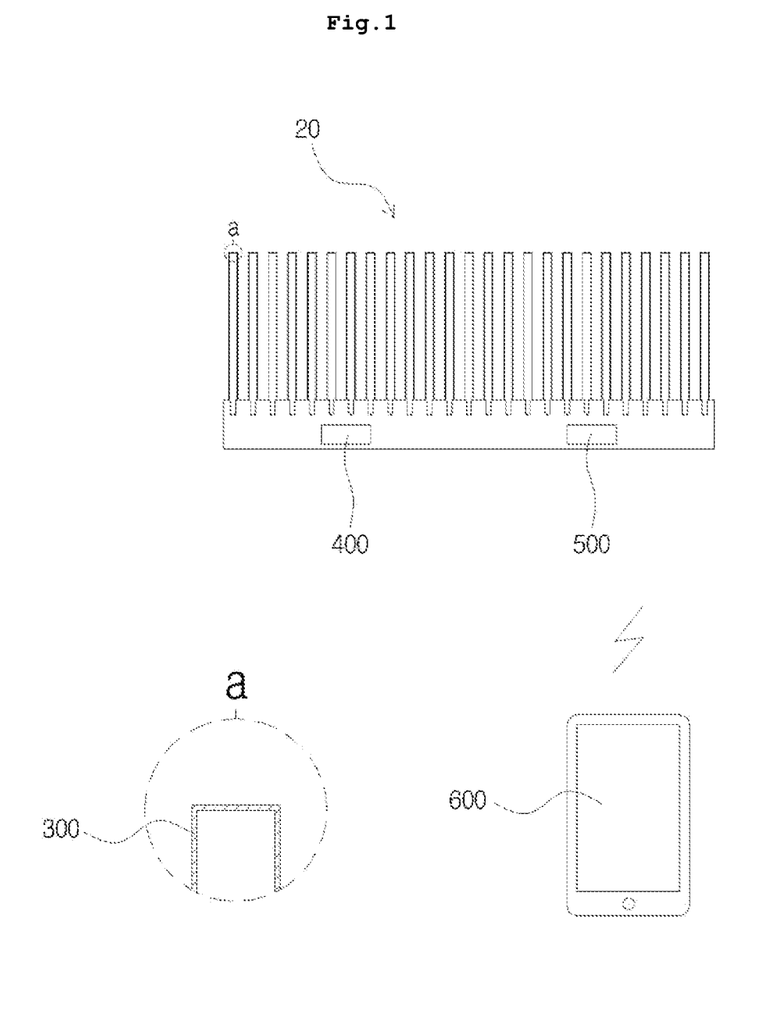
FIG. 1 is a view showing a preferred embodiment of the present invention.

Referring to FIG. 1, a specific product 20 is shown as a wig, for example, and as for the wig, a transparent microLED display skin 300 has made to worn on one side of the whole or partially, and the transparent microLED display skin is made to worn on one side or partially on the outer surface of hair part that comprises the wig, in an embodiment of the present invention is shown that the transparent microLED display skin 300 is to be worn in whole on the outer surface of the hair part (artificial hair).

Figure 2:
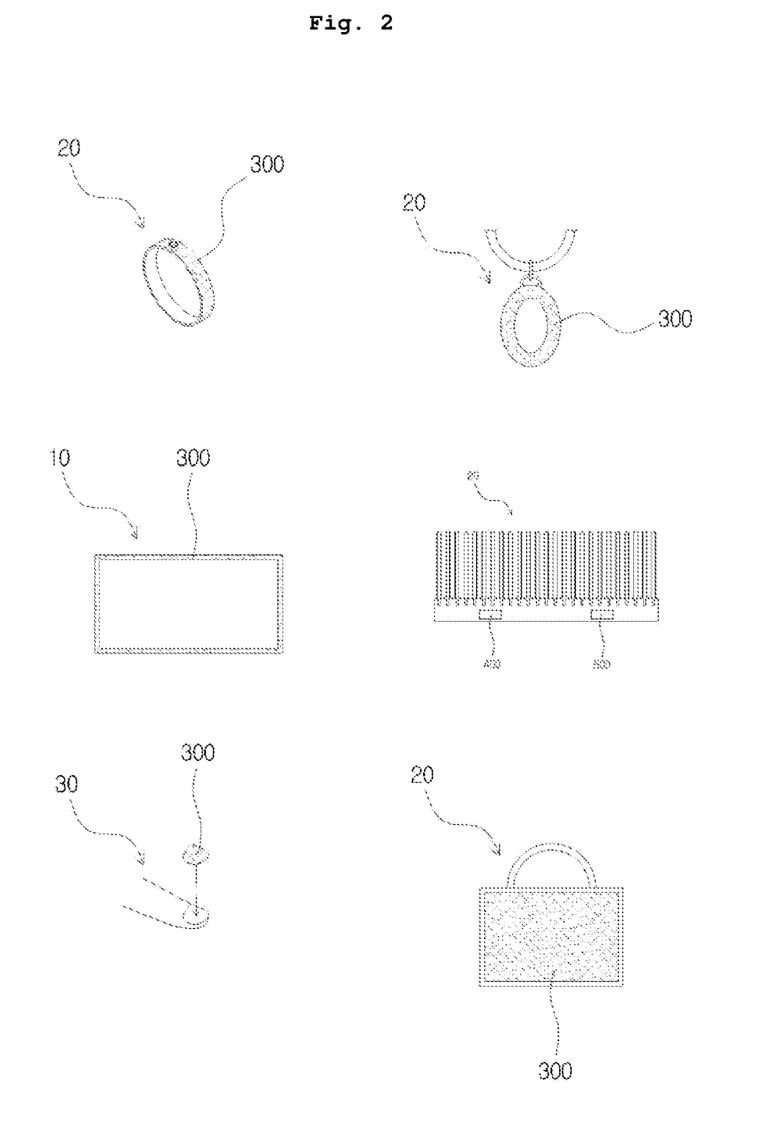
FIG. 2 is a view showing a preferred embodiment of the present invention.

First, in the case of the specific device 10, any device that can be mechanically operated, such as a general electronic product, for example, a dresser, a television, a computer, a vehicle, a motorcycle may be a device comprised of mechanical components, in the case of the specific product 20 may include, for example, a ring, a necklace, an earring, a hairband, a hat, a shoe, a wig, a glove, a bracelet, a wristwatch, an umbrella, a parasol, a dress, a fan, a handbag, and a handkerchief, and in the case of the body part 30 may include, for example, fingernails, toenails, eyebrows, legs, forearms, and in FIG. 2, the specific product 20 was illustrated as a ring, a necklace, a wig, and a handbag as an example, and the specific device 10 was illustrated as a television, and the body part 30 was illustrated as a fingernail.

In other words, the transparent microLED display skin 300 of the present invention, any one of the specific device 10, the specific product 20, and the body part 30 as described above, is worn on the outer surface selectively, and used in various fields conveniently.

Since the microLED system of the present invention is applied to various fields, when newlyweds decorate their houses, the houses may be decorated without having to spend a huge amount of money for buying separate furniture or decoration everywhere inside the house, and instead, by using the microLED system of the present invention, the decoration (interior design) may be selectively transformed and is effectively used by customizing according to the situations.

In general, once people carry out the interior design in their apartments, houses, and offices, a transformation of interior design is difficult until they move to somewhere else, however, if the microLED display system of the present invention is applied, the present invention has the effect that in addition to a simple transformation, there may be a sense of as if the place is newly designed every day. That is, when interior design is carried out, the interior design is usually configured with the specific product 10, the specific device 20, and wallpapers, however, if the transparent microLED display skin 300 of the present invention is configured on the surface of the wallpapers, not only a variety forms of design may be expressed, but also output an image just like a television screen rather than expressing simply a monotonous color in the case of the transparent microLED display skin 300 of the present invention, and accordingly, when configured on the wall of the room, the transparent microLED display skin 300 may be used similarly to a wall-mounted TV, and if the transparent microLED display skin 300 of the present invention is configured on the upper wall of the bed with bedding, there is an effect that the transparent microLED display skin 300 may be used as if watching TV before sleep. In addition, when the transparent microLED display skin 300 is configured the entire indoor space, there is an effect that separate light-emitting means (e.g. lighting, etc.) is not required due to self-light emitting capacity.

In addition, even in the case of the specific product 20 and the body part 30, the same designs, colors, and patterns may not be expressed daily, though may be selectively expressed in every single second, hour and day, so that satisfy the user's demands, and among the specific products 20, when the ornament is applied as shown in FIG. 2, the colors or design of the ornament may selectively differ and so that various expressions are possible, and when applied to rings, necklaces, bracelets, or the like, there is an effect of being able to highlight the ornament.

In addition, when applied to the fingernails, toenails, forearms, and legs of the body part 30, as young users constantly need the color changes, hence used effectively.

Figure 3:
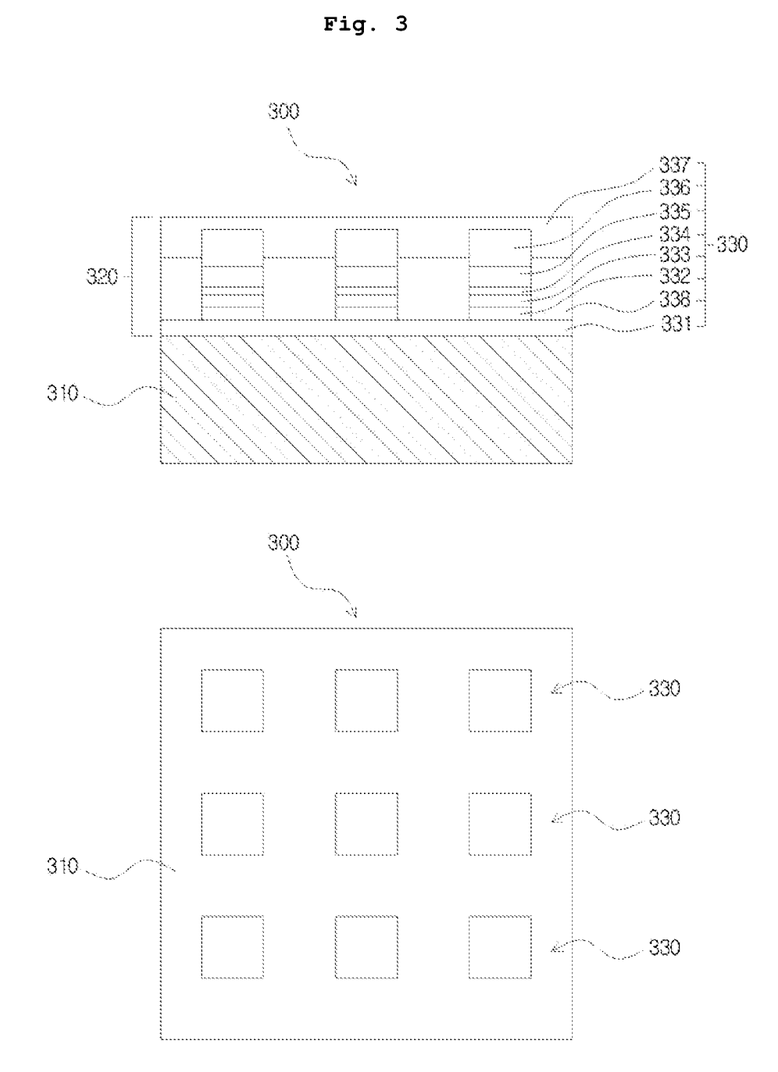
FIG. 3 is a view showing a transparent microLED display skin of the present invention.

The transparent microLED display skin 300 is a main component of the present invention, and as shown in FIG. 3, a transparent flexible substrate 310 having transparency and flexibility, and a semiconductor device layer 320 having microLED pixels 330 on the transparent flexible substrate 310 are transferred and adhered, so that configured to be worn on the surface of any one of the specific device 10, the specific product 20 and the body part 30.

The microLED display is a display (a transparent substrate in the present invention) that an ultra-small LED particles of 5-100 μm (that is, 1/100th of a centimeter) are continuously attached, and is suitable for implementing a flexible or rollable screen by utilizing the LED chip itself as a pixel, and power consumption compared to OLED is significantly low, which allows to use for a longer time, and is far more superior in terms of illuminance, Chroma and power efficiency compared to conventional OLEDs.

The transparent microLED display skin 300 as described above is configured to be worn on the surface of any one of specific device 10, the specific product 20, and the body part 30, and even in the case where the microLED display does not operate, the transparent microLED display skin 300 uses the transparent flexible substrate 310 having not only transparency but also flexibility to allow any one of the specific device 10, the specific product 20 and the body part 30 perform its role as it is, so that the pixels comprised of the microLED chip, that is the microLED pixels 330 is configured to have maximum transparency.

Meanwhile, a transparent microLED display skin 300 of the present invention is configured as a semiconductor device layer 320 having a plurality of microLED pixels 330 comprised of a micro p-n diode layer formed by transplanting on the transparent flexible substrate 310 by a microtransfer printing technique method, here, in performing the transfer printing technique, it is preferable that more than 10,000 microLED pixels 330 are transferred and adhered to the transparent flexible substrate 310 per second using the roll-transfer technique.

The microLED pixels 330 are prepared on a native substrate, then transferred and printed on the transparent flexible substrate 310, and the native substrate and unnecessary portions are moved thereafter.

The transparent flexible substrate 310 has characteristics that are transparent and ductile, and selected as a thickness range in the thickness ranges of 5-10 μm, 10-50 μm, 50-100 μm, 100-200 μm, 200-500 μm, 0.5-1 mm, 1-5 mm, 5-10 mm.

That is, as shown in FIG. 3, the transparent microLED display skin 300 is configured in a form of a semiconductor device layer 320 having microLED pixels 330 adhered on the transparent flexible substrate 310 having both transparency and flexibility.

The microLED pixels 330 of the semiconductor device layer 320 comprising: a positive electrode layer 331, a transparent conductive layer 332, a transparent p-electrode layer 333, a p-GaN layer 334, an active layer 335, an n-GaN layer 336, and a transparent n-electrode layer 337 of the upper portion, and a transparent dielectric layer 338 is configured between each microLED pixels. Each of the microLED pixels 330 formed on the semiconductor device layer 320 is a p-n diode layer, comprising a compound semiconductor having a bandgap corresponding to a specific region in the spectrum, for example, compound comprised of gallium nitride (GaN), which is a group III to V nitrides material.

The p-electrode layer 333 is for power supply and forms an electrode with an oxide containing Aluminum (Al), Gallium (Ga), Silver (Ag), Tin (Sn), Indium (In), Zinc (Zn), Cobalt (Co), Nickel (Ni) and Gold (Au) having a transmittance of 70% or more, and a positive electrode layer 331 may be formed as a circuit pattern, bump, or a conductive adhesive layer, and a transparent n-electrode layer 337 has electrical conductivity. The positive electrode 331 may be selected from the silver and nickel group having reflectivity for the visible spectrum, and forms a latent reflective mirror layer.

The present invention may implement the transparent microLED display skin 300 is fully colored by arranging three devices having colors in red, green, and blue, that is, microLED panels.

When a specific transparent microLED display skin 300 is controlled via the APP, the transparent microLED display skin 300 is controlled in the master unit 400 that is adjacent to the specific transparent microLED display skin 300 or a remote slave 500.

In addition, the transparent microLED display skin 300 may be entirely or partially configured on the outer surface of any one of a specific device 10, a specific product 20, and a body part 30 the transparent microLED display skin 300, and expressed in various colors according to the control of the smartphone 600.

Figure 4:
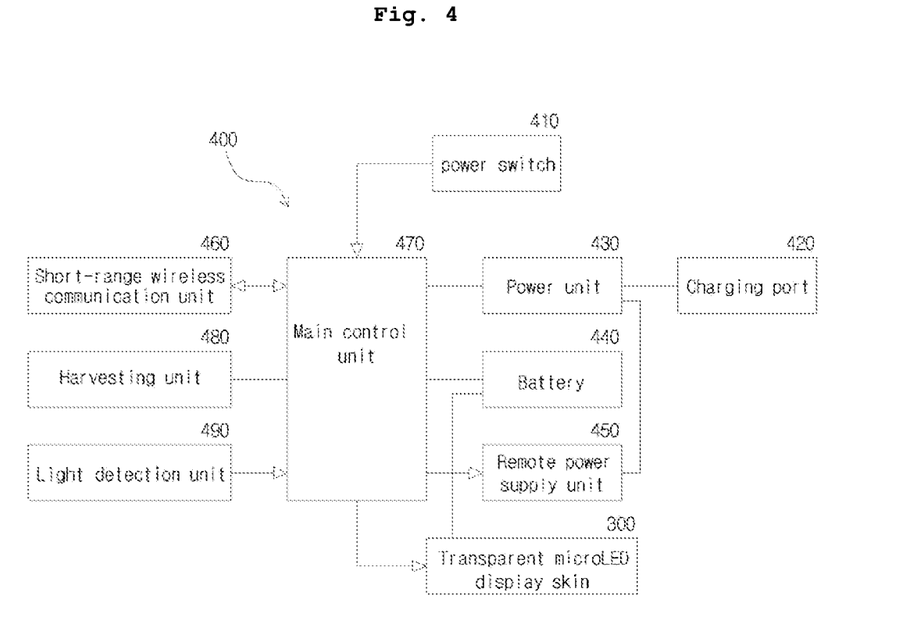
FIG. 4 is a view showing a configuration of master unit according to a preferred embodiment of the present invention.

On the other hand, the master unit 400, as shown in FIG. 4, comprises a power switch 410 controlling a power unit 430, a charging port 420 configured to charge a battery via a USB cable, a power supply unit 430 configured to be controlled from the power switch 410, a battery 440 configured to store electric power charged by the charging port 420, a wireless power supply unit 450 having a wireless electric coil for wirelessly supplying power to the power supply unit 450, a short-range wireless communication unit 460 configured to perform the short-range wireless communication with external devices including a smartphone 600 and other devices, a main control unit 470 configured to perform controlling the color expression of the transparent microLED display skin 300 configured any one of the specific device 10, the specific product 20, and the body part 30, a harvesting unit 480 for self-generating energy, a light detection unit 490 configured to detect a configuration of any one of the specific device 10, the specific product 20, and the body part 30.

The IC (integrated circuit) chip of the main control unit 470, which is embedded in any one of the specific device 10, the specific product 20, and the body part 30, is preferably implemented as an application-specific integrated circuit (ASIC), and the wireless electricity and energy harvesting unit 480 is capable of supplying energy by applying a photovoltaic cell.

Figure 5:
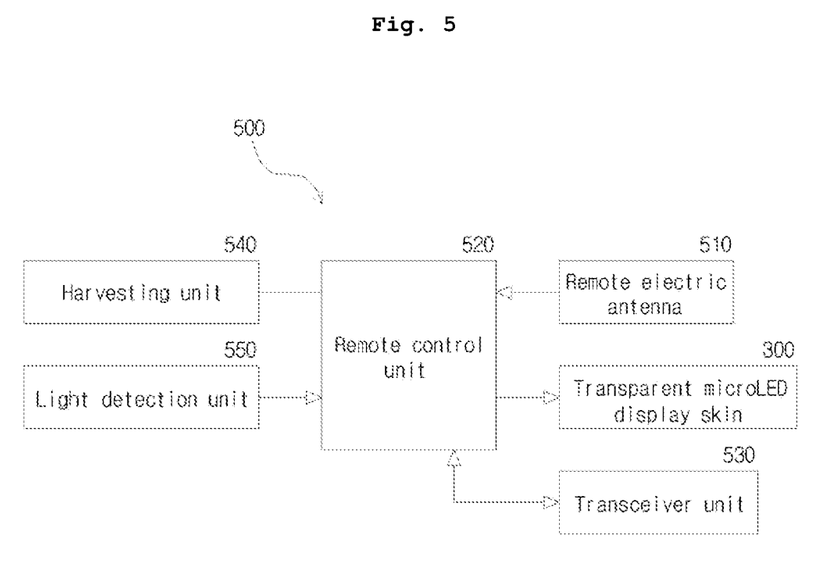
FIG. 5 is a view showing a configuration of remote slave according to a preferred embodiment of the present invention.

As shown in FIG. 5, the remote slave 500 wherein the remote slave 500 configured to wirelessly receive power supplied from the master unit 400 comprised in the position spaced in a predetermined distance between any one of the specific device 10, the specific product 20 and the body part 30, a remote electric antenna 510 configured to receive the generated power from the wireless power supply unit 450, a remote control unit 520 in a form of an IC (integrated circuit) chip for driving and controlling of the microLED transparent display skin 300, a transceiver unit 530 to perform a closest remote transceiving from/to the master unit 400, and a harvesting unit 480 for self-generating energy, a light detection unit 550 configured to detect a configuration of any one of the specific device 10, the specific product 20, and the body part 30.

The integrated circuit (IC) of the remote control unit 520 may comprise an integrated circuit in a micro-unit using a complementary-metal-oxide semiconductor (CMOS) and preferably with the IC chip having 1 mm×1 mm of the area and the thickness of 0.5 mm.

In a wireless electric coil of the power supply unit 430 configured in any one of the specific device 10, the specific product 20, and the body part 30 of the present invention, the power generated through resonance phenomenon may be received from the wireless electric antenna 510 of the remote slave 500, the power received by driving the remote control unit 520 may be used to drive the transparent microLED display skin 300.

The harvesting units 480 and 540 are means to harvest neighboring energy, which allows supplying energy to internal parts by generating power without having to provide power from a separate battery, and preferably configured of any one of a photoelectric element, a thermoelectric element, a piezoelectric element, and wireless electric conversion element, or a combination thereof, and the light detection units 490 and 550 for detecting external light brightness, and after any one of the specific device 10, the specific product 20, and the body part 30 is applied from external light intensity is being detected, then applied to the main control unit 470 and the remote control unit 520 respectively, and based on the applied light intensity, the main control unit 470 and the remote control unit 520, thereby control a display brightness of the transparent microLED display skin 300.

In addition, the remote slave 500 may be configured on the one side of any of the specific device 10, the specific product 20, and the body part 30, and may be configured to be carried by the user if needed. As the remote slave 500 is carried by the user, depending on the position of the remote slave 500, when the specific transparent microLED display skin 300 is controlled after receiving the control commands from a smartphone 600, a master unit 400 adjacent to the specific transparent microLED display skin 300 or the remote slave 500 may be in control.

On the other hand, as shown in FIG. 1, by using the short-range wireless communication method between the master unit 400 and a short-range wireless communication unit 460, a smartphone 600 further comprises the APP which may control the main control unit 470 of the remote slave 500.

The wireless transceiving method between the master unit 400 and the smartphone 600 may use Li-Fi technology realizing the fast communication speed using the wavelength of the light emitted from LEDs, when applying the microLED technology of the present invention, in particular, the effects of a component being miniaturize and lightweight is maximized.

That is, by operating the smartphone 600 of the present invention, the design and color variation may be controlled by performing the short-range remote control between the transparent microLED display skin 300 and the smartphone 600 in any one of the specific device 10, the specific product 20, the body part 30, and a configuration thereof, the master unit 400 may be connected to the smartphone 600 wirelessly using short-distance wireless communication methods such as Wi-Fi communication, Near Field communication (NFC), infrared (IR) communication, and Li-Fi communication, and when the users selectively controls the APP included in the smartphone 600, various colors may not be expressed in the transparent microLED display skin 300 according to the control commands.

In operating the transparent microLED display skin 300 with the APP of the smartphone 600 that controls the master unit 400 and the remote slave 500 of the present invention, when the initial control command is transmitted to the master unit 400, while the master unit 400 operates the transparent microLED display skin 300, if the distance between the master unit 400 and the specific transparent microLED display skin 300 is far, the control command is transmitted to the remote slave 500, and the remote slave 500 operates the corresponding transparent microLED display skin 300.

That is, when the specific transparent microLED display skin 300 is operated by the initial control command, the specific transparent microLED display skin 300 and the master unit 400 closely adjacent to the specific transparent microLED display skin 300 or the remote slave 500 allows the specific transparent microLED display skin 300 to be operated, therefore it has the advantages which allows a fast and an accurate control.

A selectively controllable microLED system according to the present invention, it is advantageous that not only a microLED display skin may easily adhere to a specific product and a body part, but also possible to apply in various fields in which provides diversity in use, and on the other hand, the selectively controllable microLED system may easily be controlled via smartphones that are always carried by users, which provides convenience when in use, and may be transformed easily in various colors and glitters in whole or in part according to the purpose of use, allowing immediate response to the situation, and as a result, not only may enhance the user's excitement and satisfaction, but also may be used for a long time through a low power and a self-powered supply such as a rechargeable battery.

The invention claimed is:

1. A selectively controllable microLED system comprising:
   a transparent microLED display skin including
      a transparent flexible substrate having transparency and flexibility and configured to be attached on the outer surface of any one of a specific device, a specific product and a body part, and
      a semiconductor device layer having microLED pixels and configured to be transferred on the transparent flexible substrate;
   a master unit spaced apart from the transparent microLED display skin, configured to be attached on the outer surface of the any one of the specific device, the specific product and the body part, and including
      a power supply unit,
      a power switch configured to control the power supply unit,
      a battery configured to store electric power,
      a charging port configured to charge the battery via a USB cable,
      a wireless power supply unit configured to wirelessly supply power to the power supply unit,
      a short-range wireless communication unit configured to perform a short-range wireless communication with external devices, and
      a main control unit configured to perform controlling a color expression of the transparent microLED display skin;
   a remote slave spaced apart from the mater unit in a predetermined distance, configured to be attached on the outer surface of the any one of the specific device, the specific product and the body part, and including
      a wireless electric antenna configured to receive power generated from the wireless power supply unit,
      a remote control unit configured to drive and control the transparent microLED display skin, and
      a transceiver to perform a remote transceiving from/to the master unit; and
   a smartphone including a short-range wireless communication unit and an APP configured to control the master unit or the remote slave, by using the short-range wireless communication method through the short-range wireless communication unit.

2. The system according to claim 1, wherein the master unit has a first light detection unit, and the remote slave has a second light detection unit, the first and second light detection unit is configured to detect external light brightness on any one of the specific device, the specific product, and the body part, and apply detected brightness signal to the main control unit and the remote control unit respectively, based on the applied light intensity, and the main control unit and the remote control unit, control a display brightness of the transparent microLED display skin.

3. The system according to claim 1, wherein the master unit has a first harvesting unit configured to self-generate energy, and the remote slave has a second harvesting unit configured to self-generate energy, and the first and second harvesting units are configured in any one of a photoelectric element, a thermoelectric element, a piezoelectric element, and wireless electric conversion element, or a combination thereof.

4. The system according to claim 1, wherein when the transparent microLED display skin is controlled via the APP, the transparent microLED display skin is controlled in the master unit.

* * * * *